United States Patent
Tang et al.

(10) Patent No.: US 8,871,032 B2
(45) Date of Patent: Oct. 28, 2014

(54) WET PROCESSING APPARATUSES

(71) Applicant: Taiwan Semiconductor Manufacturing Co., Ltd., Hsin-Chu (TW)

(72) Inventors: Kuang-Nian Tang, Zhonghe (TW); Yang-Kai Fan, Xinshi Shiang (TW); Yu-Sheng Su, Tainan (TW); Ming-Tsao Chiang, Jhubei (TW); Yu-Cheng Shih, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/911,774

(22) Filed: Jun. 6, 2013

(65) Prior Publication Data

US 2013/0263900 A1    Oct. 10, 2013

Related U.S. Application Data

(62) Division of application No. 11/754,843, filed on May 29, 2007, now Pat. No. 8,460,478.

(51) Int. Cl.
*B08B 3/00* (2006.01)
*H01L 21/67* (2006.01)

(52) U.S. Cl.
CPC .... *H01L 21/67023* (2013.01); *H01L 21/67057* (2013.01)
USPC ...................................................... 134/57 R

(58) Field of Classification Search
None
See application file for complete search history.

(56) References Cited

U.S. PATENT DOCUMENTS

| | | |
|---|---|---|
| 5,248,249 A | 9/1993 | Yamamoto et al. |
| 5,911,837 A | 6/1999 | Matthews |
| 6,001,215 A | 12/1999 | Ban |
| 6,207,068 B1 | 3/2001 | Glick et al. |
| 6,399,517 B2 | 6/2002 | Yokomizo et al. |
| 6,699,400 B1 | 3/2004 | Ballantine et al. |
| 6,979,655 B2 | 12/2005 | Niuya et al. |
| 2002/0033340 A1* | 3/2002 | Cheung et al. ............... 205/101 |
| 2002/0173154 A1 | 11/2002 | Tucker et al. |
| 2003/0203632 A1 | 10/2003 | Heo et al. |

(Continued)

FOREIGN PATENT DOCUMENTS

WO    WO-2005-067019    7/2005

OTHER PUBLICATIONS

Office Action issued on Jun. 26, 2009 in corresponding Chinese Patent Application No. 2007/101480966.

*Primary Examiner* — Jason Ko
(74) *Attorney, Agent, or Firm* — Duane Morris LLP

(57) ABSTRACT

A semiconductor apparatus includes a first tank configured to accommodate a first fluid. A second tank is configured to receive overflow of the first fluid into an upper portion of the second tank and to accommodate a second fluid. A cycling system including a first conduit is configured between the first tank and the second tank. The first conduit has an end substantially below a surface of the second fluid. A fluid providing system including a second conduit is fluidly coupled to the second tank and configured to provide the second fluid into the second tank. The second conduit has an end substantially below the surface of the second fluid. An overflow system is coupled to the second tank and configured to remove an upper portion of the second fluid when the surface of the second fluid is substantially equal to or higher than a pre-determined level.

18 Claims, 5 Drawing Sheets

(56) References Cited

U.S. PATENT DOCUMENTS

| | | |
|---|---|---|
| 2004/0140365 A1 | 7/2004 | Izuta |
| 2004/0144750 A1 | 7/2004 | Ballantine et al. |
| 2004/0187342 A1 | 9/2004 | Izuta |
| 2005/0019498 A1 | 1/2005 | Osawa |
| 2005/0067101 A1 | 3/2005 | Funabashi |
| 2005/0230045 A1 | 10/2005 | Okuchi et al. |
| 2005/0263488 A1 | 12/2005 | Change et al. |
| 2006/0057849 A1 | 3/2006 | Yim |
| 2006/0263251 A1 | 11/2006 | Watatsu et al. |

* cited by examiner

WET PROCESSING APPARATUSES

RELATED APPLICATION

This application is a divisional of U.S. patent application Ser. No. 11/754,843, filed on May 29, 2007, the contents of which are hereby incorporated by reference as if set forth in their entirety.

FIELD OF THE INVENTION

The present invention relates to semiconductor apparatuses, and more particularly to semiconductor wet processing apparatuses.

BACKGROUND

With advances in electronic products, semiconductor technology has been applied widely in manufacturing memories, central processing units (CPUs), liquid crystal displays (LCDs), light emitting diodes (LEDs), laser diodes and other devices or chip sets. In order to achieve high-integration and high-speed requirements, dimensions of semiconductor integrated circuits have been reduced and various materials, such as copper and ultra low-k dielectrics, have been proposed and are being used along with techniques for overcoming manufacturing obstacles associated with these materials and requirements. When scales of integrated circuits are reduced, thickness variations of layers of the integrated circuits may affect electrical performance thereof.

FIG. 1 is a cross-sectional view of a traditional nitride removing bench. Referring to FIG. 1, a nitride removing bench 100 includes an inner tank 110 next to an outer tank 120. The inner tank 110 accommodates phosphoric acid 115 for removing silicon nitride from substrates (not shown). The phosphoric acid 115 overflows into the outer tank 120. A cycling system 130 is configured to cycle phosphoric acid 125 stored in the outer tank 120 to the inner tank 110 through a tube 131. The cycling system 130 also has a pump 133, a heater 135 and a filter 137 connected in series. A refreshing system 140 includes a tube 141, providing fresh phosphoric acid 145 at or near to the top surface of the phosphoric acid 125. An overflow system 150 including a tube 151 is configured to remove the excess of the phosphoric acid 125 from the outer tank 120.

BRIEF DESCRIPTION OF THE DRAWINGS

The present invention is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

DETAILED DESCRIPTION

Figure 2A:
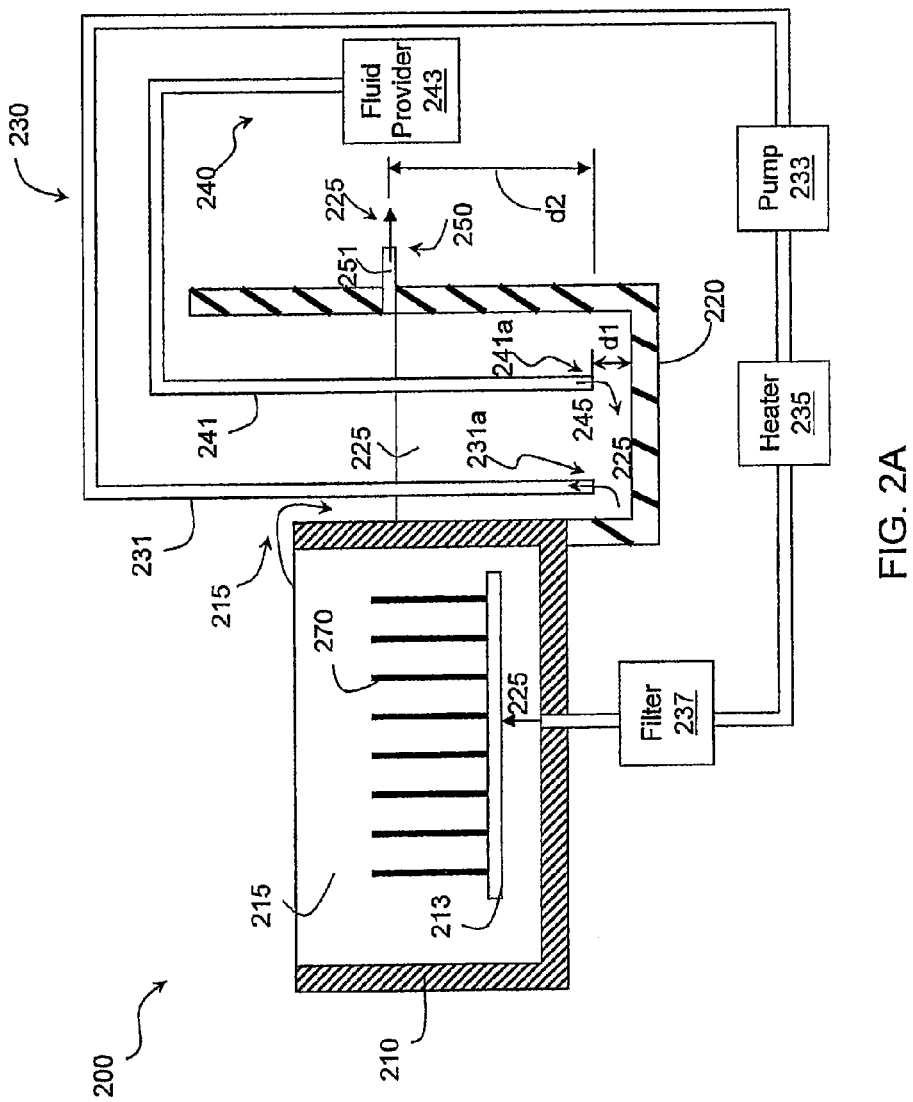
FIG. 2A is a cross-sectional view showing an exemplary semiconductor apparatus.

FIG. 2A is a cross-sectional view showing an exemplary semiconductor apparatus. Referring to FIG. 2A, a semiconductor apparatus 200 includes a tank such as an inner tank 210. A tank such as an outer tank 220 may be adjacent to the inner tank 210. The inner tank 210 is configured to accommodate a fluid such as a liquid 215 containing at least one of acid (e.g., phosphoric acid, perchloric acid, hydroidic acid, hydrobromic acid, hydrochloric acid, sulfuric acid, nitric acid, chloric acid, bromic acid, perbromic acid, iodic acid, periodic acid, fluorantimonic acid, magic acid, carborane sueracid, fluorosulfuric acid, triflic acid or other acid) and/or base (e.g., potassium hydroxide, barium hydroxide, cesium hydroxide, sodium hydroxide, strontium hydroxide, calcium hydroxide, lithium hydroxide, rubidium hydroxide, alanine, ammonia, methylamine, pyridine or other base). The liquid 215 within the inner tank 210 is provided to process at least one substrate, such as semiconductor substrates 270, immersed therein. The substrates 270 are disposed on a substrate support 213. In some embodiments, the liquid 215 is provided to remove a material formed on the substrates 270 and/or clean the substrates 270.

In some embodiments, each of the substrates 270 may include a silicon substrate, a III-V compound substrate, a silicon/germanium (SiGe) substrate, a silicon-on-insulator (SOI) substrate, a display substrate such as a liquid crystal display (LCD), a plasma display, an electro luminescence (EL) lamp display, or a light emitting diode (LED) substrate, for example. In some embodiments, the substrates 270 may comprise at least one dielectric layer, semiconductor layer, conductive layer, metallic layer, photoresist layer, diode, transistor, device, circuit or other semiconductor structure or various combinations thereof (not shown) are formed therein and/or thereover.

In some embodiments, the liquid 215 may over flow from the inner tank 210 into the outer tank 220. The outer tank 220 is configured to accommodate a fluid such as a liquid 225. The liquid 225 may be a mixture of the liquid 215 flowing from the inner tank 210 and a liquid 245 provided from a fluid provider 243.

Referring again to FIG. 2A, the semiconductor apparatus 200 may comprise a cycling system 230. The cycling system 230 may be coupled between the inner tank 210 and the outer tank 220. In some embodiments, the cycling system 230 may comprise at least one conduit such as conduit 231. The cycling system 230 is configured to deliver the liquid 225 in the outer tank 220 to the inner tank 210 through the conduit 231. An end 231a of the conduit 231 may be configured substantially below the surface of the liquid 225. In some embodiments, the end 231a of the conduit 231 is distant from an inner bottom surface (not labeled) of the outer tank 220 between about 3 centimeters (cm) and about 5 cm. Other distances between the end 231a of the conduit 231 and the bottom inner surface (not labeled) of the outer tank 220 may be used in other embodiments. By the configuration of the conduit 231, the liquid 225 may be desirably delivered from the outer tank 220 to the inner tank 210.

Referring again to FIG. 2A, the cycling system 230 may comprise at least one pump such as pump 233, at least one heater such as heater 235 and/or at least one filter such as filter 237. In some embodiments, the bump 233 may be coupled to the conduit 231. The pump 233 is operative to transfer the liquid 225 from the outer tank 220 to the inner tank 210. The pump 233 may be operative to deliver the liquid 225, such that the delivering rate of the liquid 225 is, for example, between about 19 liters/minute (L/m) and about 20 L/m. In some embodiments, the delivering rate of the liquid 225 may be about 20 L/m. Other delivery rates of the liquid 225 provided by the pump 233 may be used for other embodiments.

In some embodiments, the heater 235 may be coupled between the pump 233 and the filter 237. The heater 235 is operative to heat the liquid 225 flowing therethrough, such that the liquid 225 having a desired temperature can be delivered into the inner tank 210. The heater 235 may be operative to heat the liquid 225 to between about 159.5° C. and about 160.5° C. In some embodiments, the heater 235 may heat the liquid 225 to a temperature of about 160° C.

In some embodiments, the filter 237 may be coupled between the inner tank 210 and the heater 235. The filter 237 is configured to screen particles carried by the liquid 225 from the outer tank 220, such that the liquid 225 having a desired particle level may be delivered into the inner tank 210.

The configurations of the pump 233, the heater 235 and the filter 237 are not limited to that shown in FIG. 2A. In some embodiments, the pump 233 may be coupled between the heater 235 and the filter 237. In other embodiments, the filter 237 may be coupled between the pump 233 and the heater 235. In still other embodiments, at least two of the pump 233, the heater 235 and the filter 237 are coupled in parallel.

Referring again to FIG. 2A, the semiconductor apparatus 200 may comprise a fluid providing system 240. In some embodiments, the fluid providing system 240 may be referred to as a refreshing system. The fluid providing system 240 may be coupled to the outer tank 220 and configured to provide at least one fluid such as liquid 245 into the outer tank 220. The fluid providing system 240 may comprise at least one conduit such as conduit 241 and a fluid provider 243. In some embodiments, the fluid provider 243 may comprise a pump (not shown) configured to deliver the liquid 245 into the outer tank 220. An end 241a of the conduit 241 may be configured substantially below the surface of the liquid 225.

In some embodiments, the distance "d1" between the end 241a of the conduit 241 and an inner bottom surface (not labeled) of the outer tank 220 is between about 3 centimeters (cm) and about 5 cm. Other distances between the end 241a of the conduit 241 and the bottom inner surface (not labeled) of the outer tank 220 may be used in other embodiments. In some embodiments, the end 241a of the conduit 241 may be near to the end 231a of the conduit 231. In other embodiments, the end 241a of the conduit 241 and the end 231a of the conduit 231 may substantially equally distant from the top surface (not labeled) of the liquid 225. The end 241a of the conduit 241 and the end 231a of the conduit 231 may substantially equally distant from the bottom surface (not labeled) of the outer tank 220. In some embodiments, the distance "d1" may be between about 0.1 and about 0.25 times the total depth of the liquid 225 in outer tank 220. By the configuration of the conduit 241, the liquid 245 may be desirably delivered into the outer tank 220.

Preferably, there is a sufficiently large distance "d2" between the bottom end 241a of the conduit 241 and the overflow conduit 251 (described below), so that the overflow chemical exhausted through overflow conduit 251 is primarily "older" liquid (which may contain impurities), and the liquid remaining in the outer tank 220 is primarily fresh or recycled liquid from the fluid provider 243. One of ordinary skill can readily select a sufficiently large distance d2 (based on the flow rate and viscosity of the liquid 225) to avoid complete homogenous mixing of the liquid 225 in outer tank 220, and to maintain a desired amount of fresh or recycled liquid in the vicinity of conduit end 231a. If the viscosity of liquid 225 is low and the flow rate through conduit 241 is relatively high, then a relatively larger distance "d2" may be used to reduce the homogeneity of the liquid in outer tank 220, so that the liquid exhausted through overflow conduit 251 is substantially all "older" liquid. Further, the distance d can readily be selected to reduce turbulence in outer tank 220, to further reduce mixing and ensure that the liquid exhausted through overflow conduit 251 is primarily older liquid.

In some embodiments, the liquid 245 may comprise at least one of acid (e.g., phosphoric acid, perchloric acid, hydroidic acid, hydrobromic acid, hydrochloric acid, sulfuric acid, nitric acid, chloric acid, bromic acid, perbromic acid, iodic acid, periodic acid, fluorantimonic acid, magic acid, carborane sueracid, fluorosulfuric acid, triflic acid or other acid) and/or base (e.g., potassium hydroxide, barium hydroxide, cesium hydroxide, sodium hydroxide, strontium hydroxide, calcium hydroxide, lithium hydroxide, rubidium hydroxide, alanine, ammonia, methylamine, pyridine or other base) for processing various materials and structures. One of ordinary skill in the art would know how to use various liquid 245 to process different materials in view of the exemplary embodiments.

Referring again to FIG. 2A, the fluid providing system 240 may include the fluid provider 243 coupled to the conduit 241. The fluid provider 243 may be operative to deliver the liquid 245 into the outer tank 220 at a flow rate between about 0.6 L/m and about 0.9 L/m. In some embodiments, the delivering rate of the liquid 245 is about 0.7 L/m. Other delivering rates of the liquid 245 may be used in other exemplary embodiments. The fluid provider 243 may provide the liquid 245, such that a desired amount of the liquid 245 mixed with the liquid 225 can be delivered through the conduit 231 to the inner tank 210 for processing the substrates 270.

Referring again to FIG. 2A, the semiconductor apparatus 200 may include an overflow system 250. The overflow system 250 is provided to drain the liquid 225 if the top surface of the liquid 225 is substantially equal to or higher than a pre-determined level. In some embodiments, the overflow system 250 may be configured to drain the liquid 225 if the amount of the liquid 225 is substantially equal to or higher than a pre-determined amount.

In some embodiments, the overflow system 250 may include at least one conduit such as conduit 251. The conduit 251 may be configured into a sidewall of the outer tank 220, such that if the surface level of the liquid 225 is higher than the position of the conduit 251, the liquid 225 may flow through the conduit 251 into a tank (not shown). The use of the overflow system 250 may control the surface of the liquid 225 at a desired level over the end 231a of the conduit 231 and/or the end 241a of the conduit 241.

In some embodiments, the overflow system 250 may also include a pump (not shown). The pump may be coupled to the conduit 251 so as to drain the liquid 225 within the outer tank 220 if the amount of the liquid 225 and/or the surface level of the liquid 225 is substantially equal to or higher than a pre-determined value.

Although FIG. 2A shows an example with an inner tank 210 configured so that excess liquid spills over into an adjacent outer tank 220, other embodiments are contemplated in which an overflow tank or container (not shown) is substituted for the outer tank 220, and the overflow tank or container is fluidly coupled to the inner tank 210 via a conduit (not shown) near the top of the inner tank 210. In such a configuration, the overflow tank or container need not be adjacent to the inner tank 210.

Following are descriptions of an exemplary process for processing an exemplary substrate.

Figure 2B:
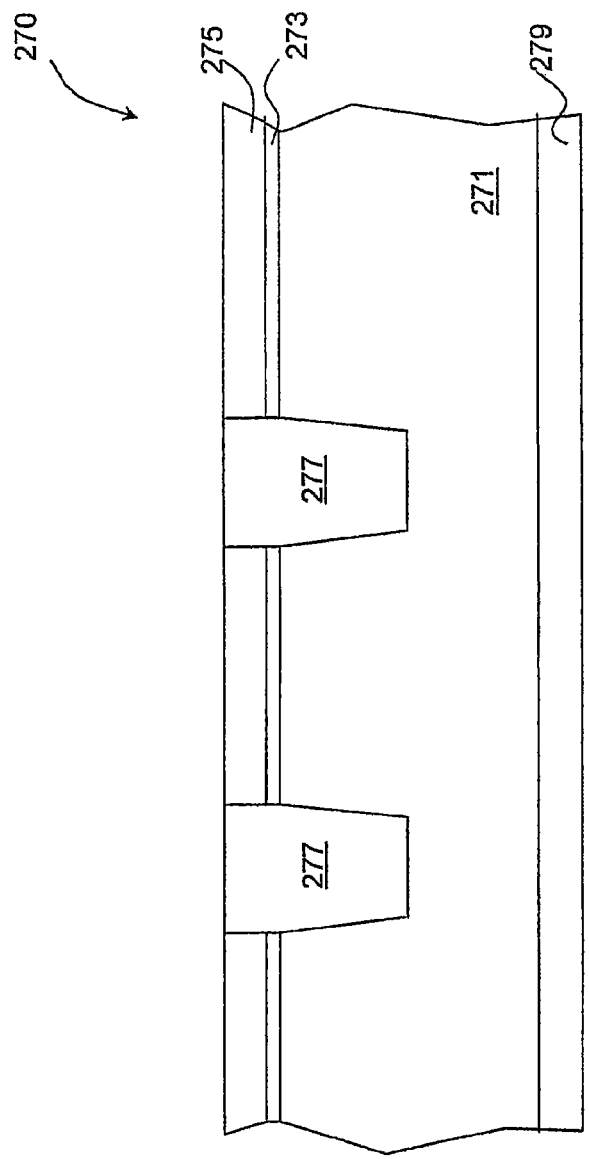
FIG. 2B is a cross-sectional view showing an exemplary structure of a substrate.

FIG. 2B is a cross-sectional view showing an exemplary structure of a substrate. Referring to FIG. 2B, the substrate 270 may comprise a substrate bulk 271. A pad oxide layer 273 is formed over the substrate bulk 271. A pad nitride layer 275 is formed over the pad oxide layer 273. At least one isolation structure such as shallow trench isolation (STI) structures 277 are formed through the pad oxide layer 273 and the pad nitride layer 275 and within the substrate bulk 271. In some embodiments, a nitride layer 279 is formed on the backside of the substrate bulk 271 while the pad nitride layer 275 is formed over the pad oxide layer 273. After the formation of the STI structures 277, the pad nitride layer 275 and/or the nitride layer 279 may be subject to a wet processing step in the inner tank 210 (shown in FIG. 2A).

During the wet processing step, the substrates 270 are immersed within the liquid 215 (shown in FIG. 2A). In order to remove the pad nitride layer 275 and/or the nitride layer 279, the liquid 215 may comprise a phosphorus-containing acid such as a phosphoric acid. Since the liquid 215 may over flow the sidewall of the inner tank 210 into the outer tank 220, the liquid 225 may also include a phosphorus-containing acid.

Before processing the substrates 270 (shown in FIG. 2B), the cycling system 230 may continuously or periodically deliver the liquid 225 from the outer tank 220 to the inner tank 210. In some embodiments, the cycling system 230 may transfer the liquid 225 at a rate between about 19 L/m and about 20 L/m. When the substrates 270 are immersed into the liquid 215, the pad nitride 275 and/or the nitride layer 279 may interact with the phosphoric acid within the liquid 215 and be gradually removed. After the pad nitride 275 and/or the nitride layer 277 are removed, the pad oxide layer 273 is exposed. Following are exemplary formulas showing the reaction of nitride and phosphoric acid:

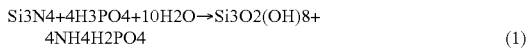

$$Si_3N_4 + 4H_3PO_4 + 10H_2O \rightarrow Si_3O_2(OH)_8 + 4NH_4H_2PO_4 \quad (1)$$

$$SiO_2 + 2H_2O \rightarrow SiO_2.(H_2O)_2 \quad (2)$$

In formula (1), $Si_3O_2(OH)_8$ is unstable and ionizes as $SiO_2$ and $H_2O_2$. In formula (2), $SiO_2.(H_2O)_2$ is also unstable and ionizes as SiO. SiO ions are active and tend to form oxide. The increase of SiO ions may undesirably thicken the pad oxide layer 273 due to the attachment of SiO on the surface of the pad oxide layer 273. In addition, the interaction of $Si_3N_4$ and $H_3PO_4$ reduces the amount of $H_3PO_4$ within the inner tank 215. Accordingly, the fluid provider 243 provides a desired amount of fresh phosphoric acid into the outer tank 225 and the cycling system 230 delivers the liquid 225 with the mixture of the liquid 215 and the liquid 245 into the inner tank 210.

Figure 1:
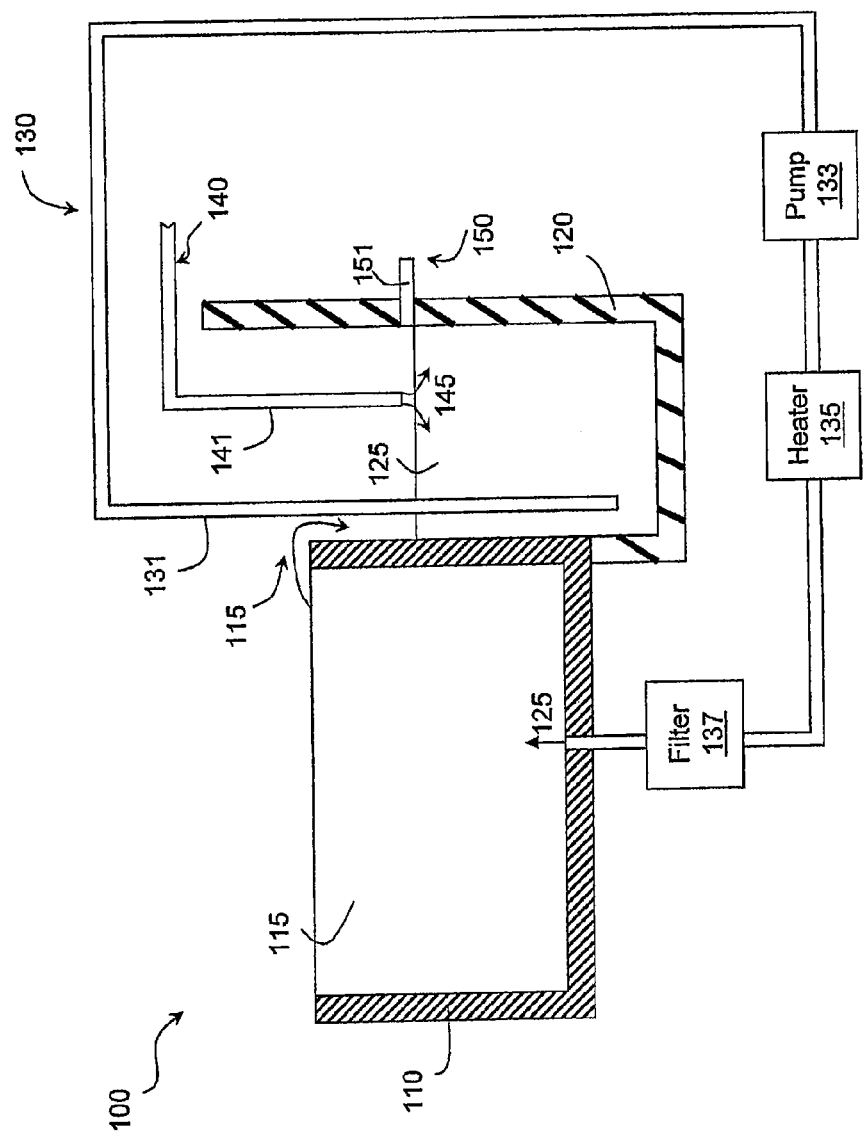
FIG. 1 is a cross-sectional view of a traditional nitride removing bench.
Figure 2C:
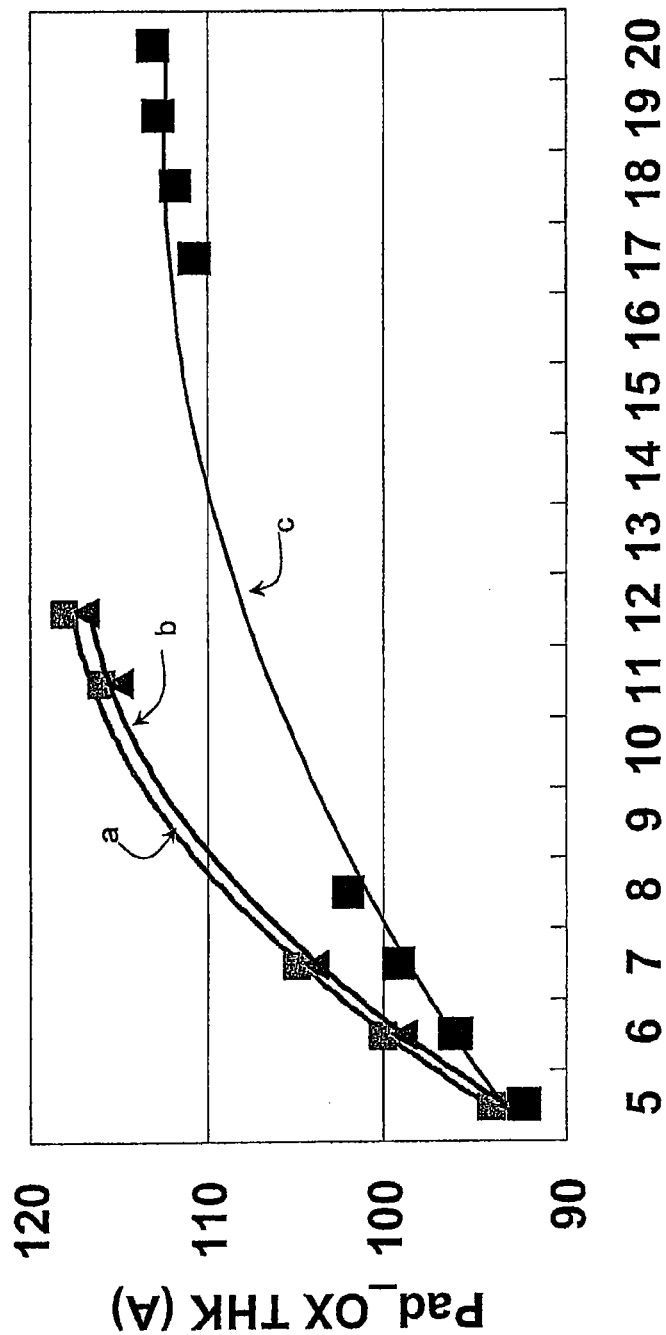
FIG. 2C is a graph showing relationships between numbers of substrate runs and thicknesses of pad oxide layers.

FIG. 2C is a graph showing relationships between numbers of substrate runs and thicknesses of pad oxide layers. Referring to FIG. 2C, curve "a" represents variations of pad oxide thickness by adding fresh phosphoric acid on or near to the surface of the liquid 125 of the outer tank 120 at 2 liters per run as shown in FIG. 1; curve "b" represents variations of pad oxide thickness by adding fresh phosphoric acid on or near to the surface of the liquid 125 of the outer tank 120 at 5 liters per run as shown in FIG. 1; and curve "c" represents variations of pad oxide thickness by the method and apparatus described in conjunction with FIG. 2A.

Referring again to FIG. 2C, the pad oxide thickness indicated by curves "a" and "b" rapidly increases with the number of wafers, regardless of whether the amount of fresh phosphoric acid added is 2 liters or 5 liters. The curve "c" shows that the pad oxide thickness smoothly increases even if many runs of substrates 270 have been processed in the inner tank 210 according to the apparatuses and methods described in conjunction with FIG. 2A. Therefore, the thickness of the pad oxide layer 273 may be desirably controlled. In some embodiments, the thickness variation of the pad oxide layer 273 may be improved from about 40 Å to about 5 Å. By using the apparatuses described in conjunction with FIG. 2A, the substrates 270 processed at different runs may have desirably controlled thickness variations of the pad oxide layers 273 and/or may have pad oxide layers 273 with substantially the same thickness. Accordingly, when the substrates 270 processed in different runs are subject to a subsequent process, such as an ion implantation process, implantation profiles of the substrates 270 may be desirably controlled and achieved.

Figure 2D:
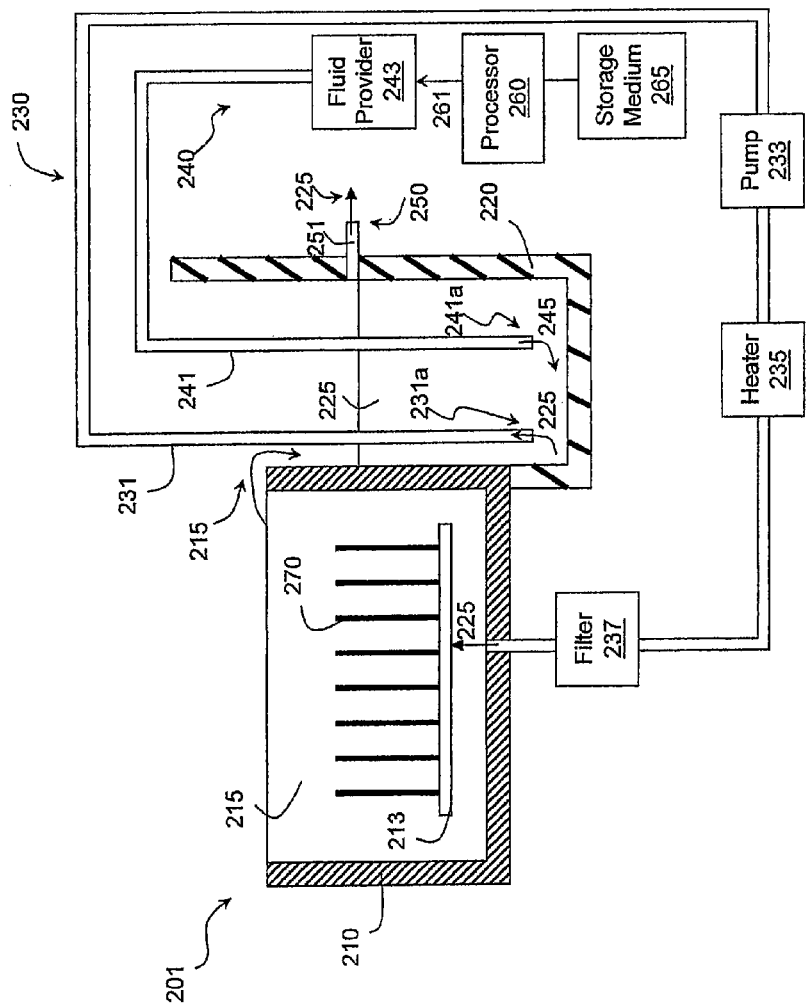
FIG. 2D is a cross-sectional view showing another exemplary semiconductor apparatus.

FIG. 2D is a cross-sectional view showing another exemplary semiconductor apparatus. In FIG. 2D, like items are indicated by reference numerals having the same value as in FIG. 2A. In some embodiments, the semiconductor apparatus 201 may include at least one storage medium such as storage medium 265. The storage medium 265 is configured to store the information regarding the number of the substrates 270 to be processed within the inner tank 210. The storage medium 265 may comprise, for example, at least one of a random access memory (RAM), floppy diskettes, read only memories (ROMs), flash drive, CD-ROMs, DVD-ROMs, hard drives, high density (e.g., "ZIP™") removable disks or any other computer-readable storage medium.

In some embodiments, the semiconductor apparatus 210 may comprise at least one processor such as processor 260. The processor 260 may be coupled to the storage medium 265 and the fluid providing system 240, e.g., the fluid provider 243. The processor 260 may be configured to generate a signal 261 corresponding to the number of the substrates 270 so as to control the flow rate and/or amount of the liquid 245 provided into the outer tank 220. In some embodiments, the processor 260 may calculate a desired amount of the liquid 245 to be provided into the outer tank 220 according to formula (3) shown below:

$$Y = 50 - 3250/(65 + 0.28X) \quad (3)$$

Y represents the amount (L) of the liquid 245 to be added and X represents a number of the substrates 270 to be processed in the inner tank 210.

In still other embodiments, the present invention may be embodied in the form of computer-implemented processes and apparatus for practicing those processes. The present invention may also be embodied in the form of computer program code embodied in tangible media, such as floppy diskettes, read only memories (ROMs), CD-ROMs, hard drives, "ZIP™" high density disk drives, flash memory drives, or any other computer-readable storage medium, wherein, when the computer program code is loaded into and executed by a computer, the computer becomes an apparatus for practicing the invention. The present invention may also be embodied in the form of computer program code, for example, whether stored in a storage medium, loaded into and/or executed by a computer, or transmitted over a suitable transmission medium, such as over the electrical wiring or cabling, through fiber optics, or via electromagnetic radiation, wherein, when the computer program code is loaded into and executed by a computer, the computer becomes an apparatus for practicing the invention. When implemented on a general-purpose processor, the computer program code segments configure the processor to create specific logic circuits.

In accordance with some embodiments, a semiconductor apparatus includes a first tank configured to accommodate a first fluid. A second tank is configured to receive overflow of the first fluid from the first tank into an upper portion of the second tank and configured to accommodate a second fluid. A cycling system is configured between the first tank and the second tank, the cycling system including at least one first conduit, the at least one first conduit having an end substantially below a surface of the second fluid within the second tank. A fluid providing system is fluidly coupled to the second tank and configured to provide the second fluid into the second tank, the fluid providing system including at least one second conduit, the at least one second conduit having an end substantially below the surface of the second fluid within the second tank. An overflow system is coupled to the second tank and configured to remove an upper portion of the second fluid from the second tank when the surface of the second fluid is substantially equal to or higher than a pre-determined level.

In accordance with some embodiments, provided is a semiconductor apparatus comprising: a first tank configured to accommodate a first fluid; a second tank adjacent to the first tank and configured to accommodate a second fluid; a cycling system configured between the first tank and the second tank, the cycling system including at least one first conduit, the at least one first conduit having an end substantially under a top surface of the second fluid within the second tank; a fluid providing system fluidly coupled to the second tank and configured to provide the second fluid into the second tank, the fluid providing system including at least one second conduit; an overflow system coupled to the second tank and configured to remove the second fluid when the top surface of the second fluid is substantially equal to or higher than a pre-determined level; a storage medium configured to store a number of substrates to be processed within the first tank; and a processor coupled to the fluid providing system and the storage medium, the processor generating a signal corresponding to the number of the substrates based on a formula to control a flow rate of the second fluid flowing into the second tank.

In some embodiments, the formula is $Y=50-3250/(65+0.28X)$, Y represents the amount of the second fluid and X represents the number of the substrates.

In some embodiments, the processor is configured to calculate an amount of the second fluid based on the formula, and the generated signal is based on the calculated amount.

In some embodiments, the end of the at least one second conduit is near to the end of the at least one first conduit.

In some embodiments, the cycling system further comprises a pump, a heater and a filter coupled in series.

In some embodiments, the second fluid flowing through the cycling system at a temperature between about 159.5° C. and about 160.5° C.

In some embodiments, the second fluid comprises a phosphoric acid and the fluid providing system is configured to provide the phosphoric acid with a flow rate between about 0.6 liter/minute (L/m) and about 0.9 L/m.

In some embodiments, the cycling system is configured to provide a cycling rate of the second fluid between about 19 L/m and about 20 L/m.

In some embodiments, an end of the at least one second conduit is distant from a bottom surface of the second tank between about 3 centimeters (cm) and about 5 cm.

In some embodiments, a distance between a bottom end of the second conduit and an overflow conduit of the overflow system through which an upper portion of the second fluid is removed, is sufficiently large, so that liquid remaining in the second tank is primarily the fresh fluid from the fluid providing system.

In some embodiments, a distance between a bottom end of the second conduit and an overflow conduit of the overflow system through which an upper portion of the second fluid is removed, is sufficiently large to avoid complete homogenous mixing of the second fluid and the overflow of the first fluid in the second tank.

In some embodiments, the end of the first conduit and an end of the second conduit are substantially equally distant from a bottom surface of the second tank.

In some embodiments, an end of the second conduit and the end of the first conduit are substantially equally distant from the top surface of the second fluid.

In some embodiments, the at least one second conduit has an end substantially below the top surface and near a bottom surface of the second tank.

In accordance with some exemplary embodiments, provided is a semiconductor apparatus. The apparatus comprises: a first tank including a first fluid and a plurality of semiconductor substrates to be processed, therein; a second tank configured to receive overflow of the first fluid from the first tank into an upper portion of the second tank and configured to further accommodate a second fluid, the first and second tanks being exclusive of each other and the second tank being a mixing tank; a cycling system having at least one first conduit and configured to carry predominantly fresh fluid to the first tank from the second tank via the at least one first conduit, the at least one first conduit having an end substantially below a surface of the second fluid near a bottom of the second tank; a fluid providing system with the second fluid therein and fluidly coupled to the second tank and configured to provide the second fluid into the second tank via at least one second conduit, the second fluid being a fresh fluid and the at least one second conduit having an end substantially below the surface of the second fluid within the second tank, near a bottom of the second tank; and an overflow system coupled to the second tank and configured to remove an upper portion of fluid from the second tank when the surface of the second fluid is substantially equal to or higher than a pre-determined level remote from the ends of the first and second conduits.

In some embodiments, the semiconductor apparatus further comprises a processor coupled to the fluid providing system and configured to deliver a signal to the fluid providing system and to control flow of the second fluid, the processor generating a signal corresponding to a number of the semiconductor substrates to control a flow rate of the second fluid flowing into the second tank.

In some embodiments, the cycling system further comprises a pump, a heater and a filter coupled in series.

In some embodiments, the heater is configured to heat the second fluid flowing through the cycling system at a temperature between about 159.5° C. and about 160.5° C.

In some embodiments, the second fluid comprises a phosphoric acid and the fluid providing system is configured to provide the phosphoric acid with a flow rate between about 0.6 liter/minute (L/m) and about 0.9 L/m.

In some embodiments, the cycling system is configured to provide a cycling rate of the second fluid between about 19 L/m and about 20 L/m.

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus/device be constructed or operated in a particular orientation.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A semiconductor apparatus, comprising:
a first tank configured to accommodate a first fluid;
a second tank adjacent to the first tank and configured to accommodate a second fluid;
a cycling system configured between the first tank and the second tank, the cycling system including at least one first conduit, the at least one first conduit having an end substantially below a top surface and near a bottom surface of the second fluid within the second tank;
a fluid providing system being exclusive of the first tank, fluidly coupled to the second tank and configured to provide the second fluid into the second tank, the fluid providing system including at least one second conduit with a delivery end substantially below the top surface and at a lower location near the bottom surface of the second tank and an inlet end coupled to the fluid providing system, the second tank positioned to receive overflow directly from the first tank at an upper location above the lower location;
an overflow system coupled to the second tank and configured to remove the second fluid when the top surface of the second fluid is substantially equal to or higher than a pre-determined level;
a storage medium configured to store a number of substrates to be processed within the first tank; and
a processor coupled to the fluid providing system and the storage medium, the processor configured to generate a signal corresponding to the number of the substrates based on a formula to control a flow rate of the second fluid flowing into the second tank and therefore a removal rate of a material formed on said substrates.

2. The semiconductor apparatus of claim 1, wherein the formula is $Y=50-3250/(65+0.28X)$, Y represents the amount of the second fluid and X represents the number of the substrates.

3. The semiconductor apparatus of claim 2, wherein the processor is configured to calculate an amount of the second fluid based on the formula, and the generated signal is based on the calculated amount.

4. The semiconductor apparatus of claim 1, wherein the delivery end of the at least one second conduit is near to the end of the at least one first conduit.

5. The semiconductor apparatus of claim 1, wherein the cycling system further comprises a pump, a heater and a filter coupled in series.

6. The semiconductor apparatus of claim 5, wherein the heater is configured to heat the second fluid flowing through the cycling system at a temperature between about 159.5° C. and about 160.5° C.

7. The semiconductor apparatus of claim 1, wherein the second fluid comprises a phosphoric acid and the fluid providing system is configured to provide the phosphoric acid with a flow rate between about 0.6 liter/minute (L/m) and about 0.9 L/m.

8. The semiconductor apparatus of claim 1, wherein the cycling system is configured to provide a cycling rate of the second fluid between about 19 L/m and about 20 L/m.

9. The semiconductor apparatus of claim 1, wherein the delivery end of the at least one second conduit is spaced from a bottom surface of the second tank between about 3 centimeters (cm) and about 5 cm.

10. The apparatus of claim 1, wherein an overflow conduit of the overflow system through which an upper portion of the second fluid is removed, is centrally disposed on a sidewall of said second tank, so that liquid remaining in the second tank is primarily the fresh fluid from the fluid providing system.

11. The apparatus of claim 1, wherein an overflow conduit of the overflow system through which an upper portion of the second fluid is removed, is centrally disposed on a sidewall of said second tank to avoid complete homogenous mixing of the second fluid and the overflow of the first fluid in the second tank.

12. The apparatus of claim 1, wherein the end of the first conduit and the delivery end of the second conduit are substantially equally distant from a bottom surface of the second tank.

13. The apparatus of claim 1, wherein the delivery end of the at least one second conduit and the end of the first conduit are substantially equally distant from the top surface of the second fluid.

14. A semiconductor apparatus, comprising:
a first tank including a first fluid and a plurality of semiconductor substrates to be processed, therein;
a second tank configured to receive overflow of the first fluid from the first tank into an upper portion of the second tank and configured to further accommodate a second fluid, the first and second tanks being exclusive of each other and the second tank being a mixing tank that receives fluid from both the overflow and a fluid providing system;
a cycling system having at least one first conduit and configured to carry predominantly fresh fluid to the first tank from the second tank via the at least one first conduit, the at least one first conduit having an end substantially below a surface of the second fluid near a bottom of the second tank;
the fluid providing system with the second fluid therein, exclusive of the first tank and fluidly coupled to the second tank and configured to provide the second fluid into the second tank via at least one second conduit, the second fluid being a fresh fluid and the at least one second conduit having an end substantially below the surface of the second fluid within the second tank, near a bottom of the second tank and a further end coupled to the fluid providing system;

an overflow system coupled to the second tank and configured to remove an upper portion of fluid from the second tank when the surface of the second fluid is substantially equal to or higher than a pre-determined level remote from the ends of the first and second conduits, the overflow system having an overflow port through which the fluid from the second tank is removed and which is disposed at a vertically central location on a sidewall of the second tank; and a processor configured to deliver a signal to the fluid providing system and to control flow of the second fluid, the processor generating a signal corresponding to a number of the semiconductor substrates based on a formula to control a flow rate of the second fluid flowing into the second tank and therefore a removal rate of a material from said semiconductor substrates.

15. The semiconductor apparatus of claim 14, wherein the cycling system further comprises a pump, a heater and a filter coupled in series.

16. The semiconductor apparatus of claim 15, wherein the heater is configured to heat the second fluid flowing through the cycling system at a temperature between about 159.5° C. and about 160.5° C.

17. The semiconductor apparatus of claim 14, wherein the second fluid comprises a phosphoric acid and the fluid providing system is configured to provide the phosphoric acid with a flow rate between about 0.6 liter/minute (L/m) and about 0.9 L/m.

18. The semiconductor apparatus of claim 14, wherein the cycling system is configured to provide a cycling rate of the second fluid between about 19 L/m and about 20 L/m.

* * * * *